United States Patent
Ries

(10) Patent No.: US 6,707,302 B2
(45) Date of Patent: Mar. 16, 2004

(54) MAGNETIC RESONANCE APPARATUS HAVING A BASIC FIELD MAGNET WITH DAMPING OF MECHANICAL OSCILLATIONS

(75) Inventor: Guenter Ries, Erlangen (DE)

(73) Assignee: Siemens Aktiengesellschaft, Münich (DE)

( * ) Notice: Subject to any disclaimer, the term of this patent is extended or adjusted under 35 U.S.C. 154(b) by 0 days.

(21) Appl. No.: 10/165,789

(22) Filed: Jun. 7, 2002

(65) Prior Publication Data

US 2003/0006773 A1 Jan. 9, 2003

(30) Foreign Application Priority Data

Jun. 7, 2001 (DE) .......................................... 101 27 822

(51) Int. Cl.⁷ ................................................. G01V 3/00
(52) U.S. Cl. ..................................................... 324/318
(58) Field of Search ................................ 324/318, 322, 324/307, 309, 320

(56) References Cited

U.S. PATENT DOCUMENTS

| | | | |
|---|---|---|---|
| 4,990,878 A | | 2/1991 | Takechi et al. |
| 5,227,728 A | * | 7/1993 | Kaufman et al. ............. 324/322 |
| 5,396,173 A | * | 3/1995 | Sakakura et al. ............ 324/318 |
| 5,453,692 A | * | 9/1995 | Takahashi et al. ........... 324/318 |
| 5,489,848 A | * | 2/1996 | Furukawa .................... 324/318 |
| 5,576,622 A | * | 11/1996 | Morrone et al. ............. 324/318 |
| 5,698,980 A | | 12/1997 | Sellers et al. |
| 5,773,976 A | * | 6/1998 | Sakakura et al. ............ 318/460 |
| 6,150,816 A | * | 11/2000 | Srinivasan ................... 324/318 |
| 6,404,200 B1 | * | 6/2002 | Dietz et al. .................. 324/318 |
| 6,437,568 B1 | * | 8/2002 | Edelstein et al. ............ 324/318 |
| 6,448,774 B1 | * | 9/2002 | Heid ............................ 324/318 |
| 6,501,275 B1 | * | 12/2002 | Westphal ..................... 324/319 |
| 6,552,543 B1 | * | 4/2003 | Dietz ........................... 324/318 |
| 6,556,012 B2 | * | 4/2003 | Yamashita ................... 324/318 |

FOREIGN PATENT DOCUMENTS

| | | |
|---|---|---|
| DE | OS 39 00 725 | 7/1990 |
| DE | OS 42 09 137 | 9/1992 |
| GB | 2153080 A * | 8/1985 |

OTHER PUBLICATIONS

Formulas for Natural Frequency and Mode Shape, Blevins (1973) pp. 1–10, 291–299, 300–326.

* cited by examiner

*Primary Examiner*—Diego Gutierrez
*Assistant Examiner*—Dixomara Vargas
(74) *Attorney, Agent, or Firm*—Schiff Hardin LLP

(57) ABSTRACT

A magnetic resonance apparatus has a basic field magnet with an inner unit, an outer unit and at least one middle unit that are essentially hollow-cylindrical and are electrically conductive and that are arranged inside one another such that the inner unit is enveloped by the middle unit and the middle unit is enveloped by the outer unit, and a gradient coil system which induces eddy currents at least in regions of the outer unit. At least the inner cylindrical jackets of the units are matched to one another in term of mechanical properties according so that the middle unit effectively damps oscillatory transmission from the outer unit to the inner unit that would otherwise occur due to magnetic coupling.

10 Claims, 8 Drawing Sheets

MAGNETIC RESONANCE APPARATUS HAVING A BASIC FIELD MAGNET WITH DAMPING OF MECHANICAL OSCILLATIONS

BACKGROUND OF THE INVENTION

1. Field of the Invention

The invention is directed to a magnetic resonance apparatus.

2. Description of the Prior Art

Magnetic resonance technology is a known technique for acquiring images of the inside of the body of an examination subject. To that end, rapidly switched gradient fields that are generated by a gradient coil system are superimposed on a static basic magnetic field generated by a basic field magnet in a magnetic resonance apparatus. Further, the magnetic resonance apparatus has a radio-frequency system that emits radio-frequency signals into the examination subject for triggering magnetic resonance signals, and that picks up the generated magnetic resonance signals, from which magnetic resonance images are generated.

A superconducting basic field magnet has, for example, an essentially hollow-cylindrical helium container in which superconducting coils are arranged, these being cooled by the liquid helium that surrounds them. The helium container is surrounded by a hollow-cylindrical, inner cryoshield that is in turn surrounded by a hollow-cylindrical, outer cryoshield. The cryoshields allow as little thermal radiation as possible to penetrate to the helium container. To that end, the cryoshields are fashioned of a highly thermally conductive metal, for example aluminum. The cryoshields and/or the helium container are thereby held to prescribed temperatures by a cryo-cooler, cold gas or liquid nitrogen. The outer cryoshield is surrounded by an essentially hollow-cylindrical vacuum container. The containers are usually fashioned of nonmagnetic stainless steel. The helium container is connected to the inner cryoshield, the two cryoshields are connected to one another and the outer cryoshield is connected to the vacuum container with poor thermal conductivity up to a mutual spacing of a few millimeters.

The hollow-cylindrical gradient coil system is secured in the cylindrical cavity of the vacuum container, for example by being force-fit in the cavity. For generating gradient fields, suitable currents are set in the gradient coils of the gradient coil system. The amplitudes of the required currents can be up to several 100 A. The current rise and decay rates can be up to several 100 kA/s. Given an existing basic magnetic field on the order of magnitude of 1 T, Lorentz forces that lead to vibrations of the gradient coil system act on these time-variable currents in the gradient coils.

As discussed in German OS 195 31 216, for example, these vibrations have a number of negative properties, such as acoustic noises that emanate from the gradient coil system and structural noises that emanate from the gradient coil system and are transmitted onto the rest of the magnetic resonance apparatus via the fastenings, as well as image quality disturbances that can be caused by excessive movement of the gradient coil system. German OS 195 31 216 therefore proposes that the gradient coil system be secured in the region of a vibratory node that is to be expected during operation. Disadvantageous influences of vibrations that emanate from the gradient coil system on the rest of the magnetic resonance apparatus are prevented as a result.

Since the gradient coil system is surrounded by conductive structures of the basic field magnet, for example by the steel vacuum container and the outer cryoshield of aluminum, the gradient fields that are switched induce eddy currents in the conductive structures. The fields that accompany the eddy currents are unwanted because they attenuate the gradient fields if counter-measures are not taken, and distort the gradient fields in terms of their time curve, which leads to degradation of the quality of the magnetic resonance images. Further, the eddy currents induced in the conductive structures of the basic field magnet cause an inherently unwanted heating of the basic field magnet. These disadvantageous influences are reduced by utilizing an actively shielded gradient coil system.

SUMMARY OF THE INVENTION

An object of the present invention is to provide an improved resonance apparatus wherein, among other things, unwanted eddy current effects are governed better.

This object is achieved in a magnetic resonance apparatus according to the invention having a basic field magnet with an inner unit, an outer unit and at least one middle unit that are essentially hollow-cylindrical and are electrically conductive and that are arranged inside one another such that the inner unit is enveloped by the middle unit and the middle unit is enveloped by the outer unit, and a gradient coil system which causes eddy currents to be induced at least in regions of the outer unit, and wherein at least the inner cylindrical jackets of the units are matched to one another in terms of mechanical properties so that the middle unit effectively damps oscillatory transmission from the outer unit to the inner unit that would otherwise arise due to magnetic coupling.

In the initially described basic field magnet of the prior art, the gradient fields are in fact shielded well from the helium container, particularly by the vacuum container, but the eddy currents produced in the vacuum container due to the gradient fields have accompanying fields that in turn produce eddy currents in the outer cryoshield. Due to the strong basic magnetic field, this leads to a vibratory movement of the outer cryoshield, causing further eddy currents to be generated due to the movement. The fields of the eddy currents occurring in the outer cryoshield in turn induce eddy currents in the inner cryoshield, etc., and the above-described, magnetic coupling propagates to the helium container.

The invention is based on the perception that the above-described oscillatory transmission due to magnetic coupling from the vacuum container in the direction to the helium container is especially pronounced when a mode of characteristic (natural) oscillation that is the same for the inner cylinder jackets of the helium container, of the cryoshields and of the vacuum container has characteristic frequencies (eigenfrequencies) for the individual cylindrical jackets that are approximately the same. With respect to the same mode of natural oscillation, the inner cylindrical jackets behave in a manner comparable to a series circuit of filters with nearly identical passbands with respect to oscillatory transmission due to the magnetic coupling. This is the case given the initially described basic field magnet of the prior art with containers and shields of steel and/or aluminum.

According to the invention, in contrast, at least one inner cylindrical jacket of one of the containers and shields is fashioned such that it exhibits a detuned characteristic frequency compared to the cylindrical jackets of the other containers and shields for an identical mode of characteristic oscillation. The cylindrical jackets thus behave in a manner comparable to a series circuit of filters having different passbands, so that the correspondingly fashioned cylindrical jacket acts as a magneto-mechanical blocking filter that effectively damps the forwarding of oscillations and losses. As a result, the eddy currents are minimized in the helium container, resulting in a lower evaporation rate of the liquid helium due to the slight heating of the helium container induced by eddy currents. Accordingly, time intervals for replenishing the liquid helium are long in an economically advantageous way.

DESCRIPTION OF THE PREFERRED EMBODIMENTS

Figure 1:
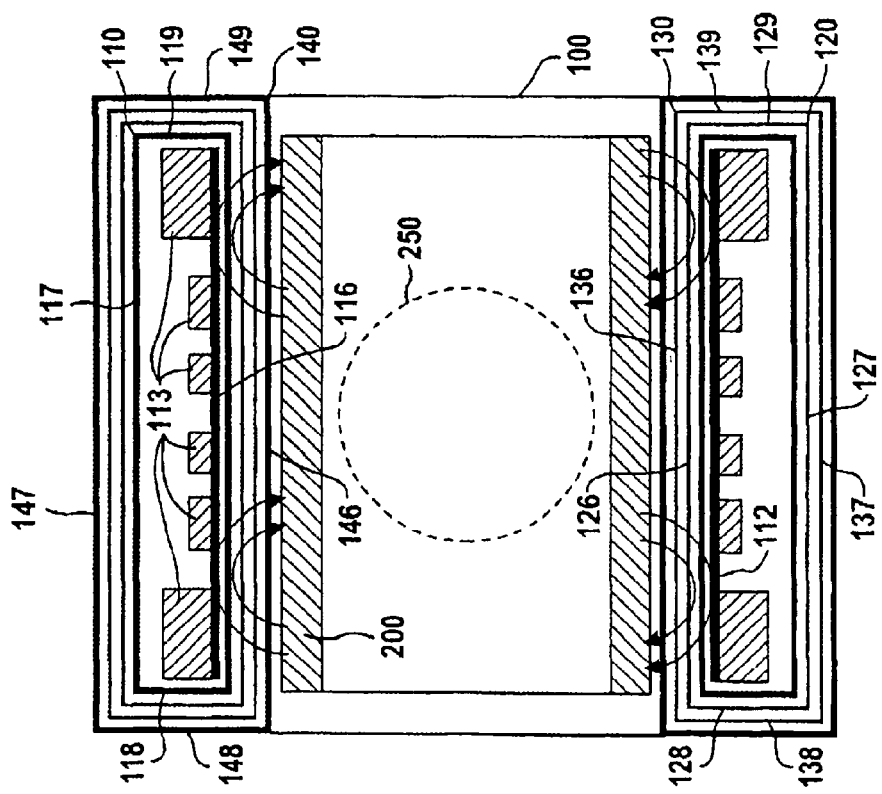
FIG. 1 is a longitudinal section through a magnetic resonance apparatus in accordance with the invention.

FIG. 1 shows a longitudinal section through a magnetic resonance apparatus as an exemplary embodiment of the invention. The magnetic resonance apparatus has a basic field magnet 100 and a gradient coil system 200. An optimally uniform, static basic magnetic field is generated with the basic field magnet 100 at least within an imaging volume 250 of the magnetic resonance apparatus. Rapidly switched, magnetic gradient fields that are generated by the gradient coil system 200 are superimposed on the basic magnetic field within the imaging volume 250. Further, known components of the magnetic resonance apparatus such as a radio-frequency antenna system, are not shown for reasons of clarity.

The basic field magnet 100 is fashioned as an essentially hollow-cylindrical, superconducting basic field magnet. The basic field magnet 100 has an essentially hollow-cylindrical helium container 110 wherein superconducting solenoid coils 113 are arranged on a winding carrier 112. The solenoid coils 113 are cooled to 4.2 K by the liquid helium that surrounds them. The helium container 110 is surrounded by a hollow-cylindrical 20-K cryoshield 120 that is in turn surrounded by a hollow-cylindrical 80-K cryoshield 130. The cryoshields 120 and 130 allow optimally little thermal radiation to penetrate from the outside to the helium container 110 and they are implemented with a highly thermally conductive metal. By means of cryo-coolers, cold gas or liquid nitrogen, the 20-K cryoshield 120 is held at a temperature of 20 K and the 80-K cryoshield 130 is held at a temperature of 80 K. Finally, the 80-K cryoshield 130 is surrounded by an essentially hollow-cylindrical vacuum container 140. The helium container 110 is connected to the 20-K cryoshield 120, the two cryoshields 120 and 130 are connected to one another and the 80-K cryoshield 130 is connected to the vacuum container 140 in poorly thermally conductive fashion and at a mutual spacing of a few millimeters through a few centimeters, for example via thin fiber glass rods. The containers 110 and 140 and cryoshields 120 and 130 are respectively composed of an inner cylindrical jacket 116, 146, 126 and 136 and an outer cylindrical jacket 117, 147, 127 and 137 that are connected to one another via two end faces 118 and 119, 148 and 149, 128 and 129 as well as 138 and 139, that are like apertured disks. The essentially hollow-cylindrical gradient coil system is arranged in the cylindrical cavity of the vacuum container 140, for example by being force-fit in the cavity. The gradient fields are generated by suitable currents in gradient coils of the gradient coil system 250.

Figure 2:
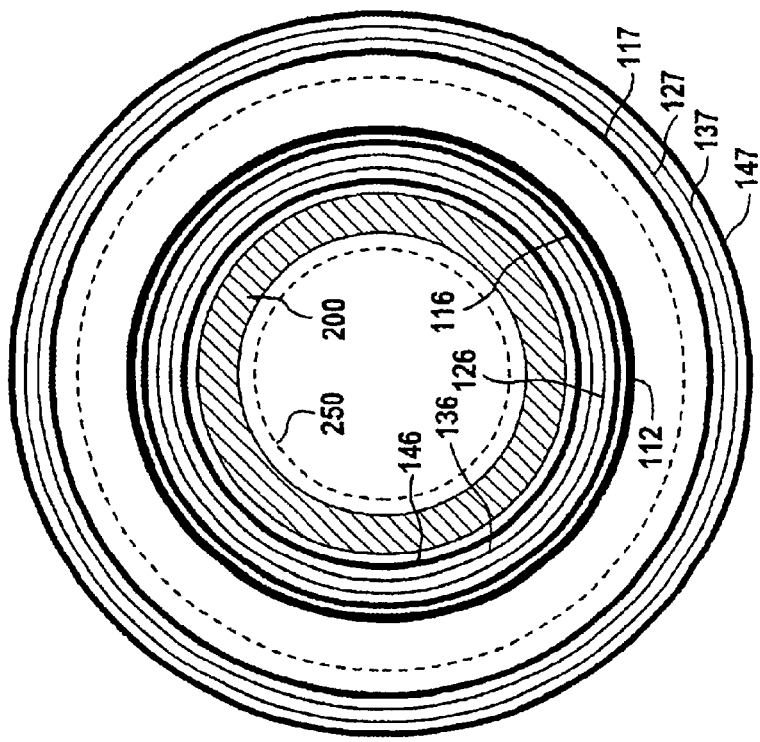
FIG. 2 is a cross-section through a magnetic resonance apparatus in accordance with the invention.

FIG. 2 shows a cross-section through the middle of the magnetic resonance apparatus of FIG. 1. The components of the magnetic resonance apparatus are referenced in conformity with FIG. 1.

The following materials are selected for the containers 110 and 140 and cryoshields 120 and 130: the vacuum container 140 is made of stainless steel, the 80-K cryoshield 130 is made of copper or brass, the 20-K cryoshield 120 is made of aluminum and the helium container 110 is made of stainless steel. The result of the aforementioned selection of materials is that the characteristic frequencies of the inner cylindrical jackets 146, 126 and 116 of the vacuum container 140, and the characteristic frequencies of the 20-K cryoshield 120 and of the helium container 110 of stainless steel or aluminum in fact are comparable at least for a mode of characteristic oscillation that is the same for the containers 110 and 140 and cryoshields 120 and 130. In contrast thereto, however, the inner cylinder jacket 136 of the 80-K cryoshield 130 exhibits a characteristic frequency that is detuned relative to the aforementioned characteristic frequency due to the jacket 136 being fashioned of copper or brass. As a result, the oscillatory transmission due to the magnetic coupling described with respect to claim 1—and which is indicated by arcuate arrows in FIG. 1—is inhibited in the direction of the helium container 110. This is explained in detail below.

Figure 3:
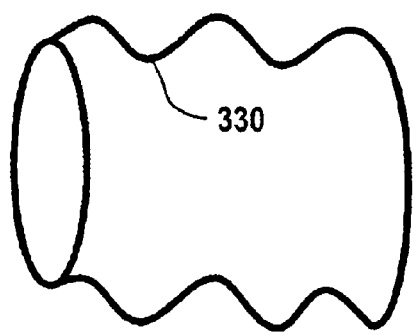
FIGS. 3 through 8 respectively illustrate different modes of characteristic oscillation of a cylindrical jacket.
Figure 4:
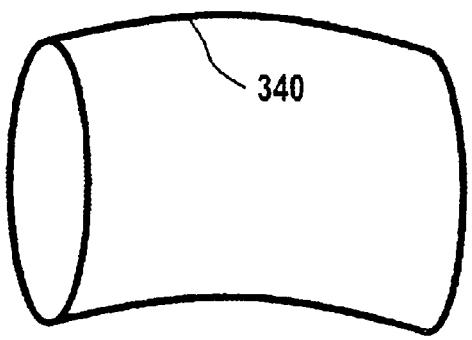
Figure 5:
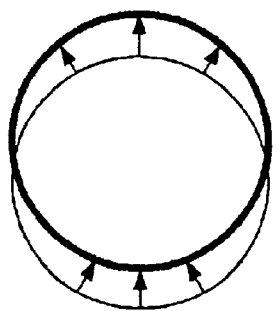

FIGS. 3 through 5 show forms of characteristic oscillation of one of the inner cylindrical jackets 116, 126, 136 or 146 that, in particular, are induced by transverse gradient coils of the gradient coil system 200. FIG. 3 shows a side view of a first characteristic oscillatory mode 330 of the cylindrical jacket 116, 126, 136 or 146 with a wave-like deformation in the axial direction, whereby a cross-section of the cylindrical jacket 116, 126, 136 or 146 in fact moves in oscillatory fashion outside nodes of the characteristic oscillatory form 330 but is not deformed itself. FIG. 4 shows a second characteristic oscillatory mode 340 of one of the inner cylindrical jackets 116, 126, 136 or 146 that differs from the first characteristic oscillatory mode 330 of FIG. 3 only in that it exhibits a wave form having a longer wavelength that deforms the inner cylindrical jacket 116, 126, 136 or 146 according to a bending vibration. Allocated to FIGS. 3 and 4, FIG. 5—considering the inner cylindrical jacket 116, 126, 136 or 146 in the axial direction—illustrates how the cross-section of the cylindrical jacket 116, 126, 136 or 146 moves in oscillatory fashion given the first and second characteristic oscillatory modes 330 and 340 without being deformed itself.

Figure 6:
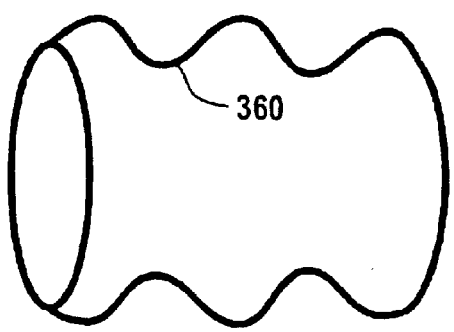
Figure 7:
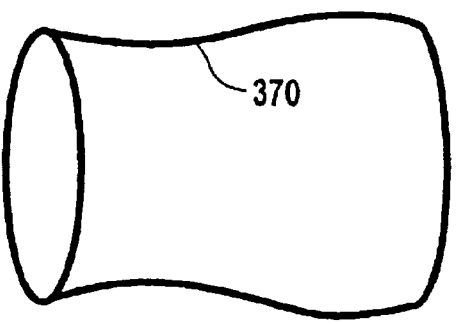
Figure 8:
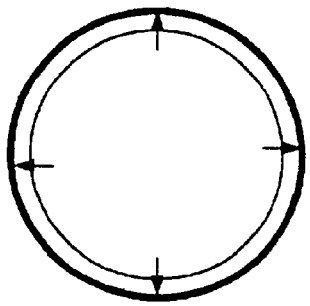

FIGS. 6 and 8 show characteristic oscillatory modes of one of the inner cylindrical jackets 116, 126, 136 or 146 that, in particular, can be excited by a longitudinal gradient coil of the gradient coil system 200. FIG. 6 shows a third characteristic oscillatory mode 360 of the cylindrical jacket 116, 126, 136 or 146 having a wave-like deformation in the axial direction, whereby the wave-like deformation is induced by a deformation of the cross-section that is different at different locations in the axial direction. This causes mechanical compression and stretching of the cylindrical jacket 116, 126, 136 or 146 in the circumferential direction and corresponding, tangential, elastic restoring forces. FIG. 7 shows a fourth characteristic oscillatory mode 370 of one of the inner cylindrical jackets 116, 126, 136 or 146 that differs from the characteristic oscillatory mode 360 of FIG. 6 only in that it has a waveform having a longer wavelength. Allocated to FIGS. 6 and 7, FIG. 8—considering the cylindrical jacket 116, 126, 136 or 146 in axial direction—illustrates how the cross-section of the cylindrical jacket 116, 126, 136 or 146 deforms given the third and fourth characteristic oscillatory modes 360 and 370.

The characteristic frequency of one of the inner cylindrical jackets 116, 126, 136 or 146 is dependent on the geometry as well as on the material of the cylindrical jacket 116, 126, 136 or 146. The characteristic frequency f0 for the third or fourth characteristic oscillatory modes 360 or 370, which are shown in FIGS. 6 and 7, can be calculated in simplified form according to the following equation:

$$f_0 = \frac{1}{2\pi}\sqrt{\frac{E}{R^2\rho}}$$

The effective modulus of elasticity of the cylindrical jacket 116, 126, 136 or 146 is referenced E, the density thereof is referenced ρ and the radius thereof is referenced R. The aforementioned equation is from the book by R. D. Blevins, "Formulas for Natural Frequency and Mode Shapes", van Nostrand-Verlag, New York, 1973, page 304, table 12-2, for the radial characteristic oscillatory mode No. 3.

With R=0.44 m, E=170 $GN/m^2$ and ρ=7700 $kg/m^3$, a characteristic frequency $f_0$=1700 Hz arises for the vacuum container of stainless steel.

With R=0.465 m, E=120 $GN/m^2$ and ρ=8900 $kg/m^3$, a characteristic frequency $f_0$=1257 Hz arises for the 80-K cryoshield of copper.

With R=0.475 m, E=79 $GN/m^2$ and ρ=2700 $kg/m^3$, a characteristic frequency $f_0$=1812 Hz arises for the 20 K cryoshield of aluminum.

With R=0.5 m, E=210 $GN/m^2$ and ρ=7700 $kg/m^3$, a characteristic frequency $f_0$=1662 Hz arises for the helium container of stainless steel.

One can see that the characteristic frequencies $f_0$ of the inner cylindrical jackets 146, 126 and 116 of the vacuum container 140, of the 20 K cryoshield 120 as well as of the helium container 110 lie close to one another and the characteristic frequency $f_0$ of the 80-K cryoshield 130, in contrast, exhibits a noticeable detuning. The reason for the frequency spacing of more than 400 Hz between the characteristic frequency $f_0$ of the cylindrical jacket 130 given the 80-K cryoshield 130 from the characteristic frequency $f_0$ for the 20-K cryoshield and for the containers 110 and 140 is that the ratio of modulus elasticity E to density ρ for the 80-K cryoshield 130 formed of copper or brass clearly differs from corresponding conditions for the containers 110 and 140 of stainless steel and the 20-K cryoshield 120 of aluminum.

Figure 9:
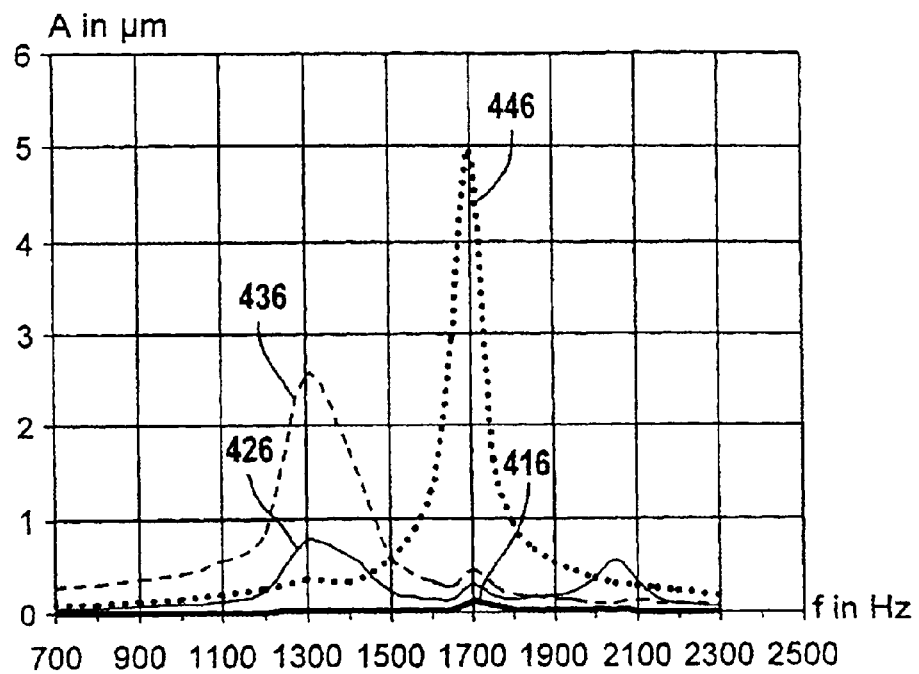
FIG. 9 shows curves of an oscillatory amplitude of components of a basic field magnet with respect to the frequency in an inventive magnetic resonance apparatus.

The effects of the aforementioned detuning on the vibratory transmission and on the eddy current losses in the basic field magnet 100 shall be considered in greater detail below. For the above-described basic field magnet 100 having the 80-K cryoshield 130 of copper, FIG. 9 shows curves 416, 426, 436 and 446 of an axially directly oscillatory amplitude A of the inner cylindrical jackets 116, 126, 136 and 146 dependent on the frequency f given an excitation of the first characteristic oscillatory form 330 corresponding to FIG. 3. Triggered by the gradient coil system 200, eddy currents are induced in the cylindrical jacket 146 of the vacuum container 140 that place the vacuum container 140 into vibration in the strong basic magnetic field. As a result further eddy currents are induced. The curve 446 of the oscillatory amplitude A of the vacuum container 140 with respect to the frequency f is shown with a dot-dashed line and exhibits a maximum in the region of the characteristic frequency of the excited, first characteristic oscillatory form 330. Due to the magnetic coupling, a transmission of the oscillation of the vacuum container 140 to the 80-K cryoshield 130 occurs. The curve 436 of the oscillatory amplitude A of the cylindrical jacket 136 of the 80-K cryoshield 130 with respect to the frequency f is shown with a broken line and exhibits a maximum in the region of the characteristic frequency of the excited, first characteristic oscillatory form 330. The characteristic frequency at 80-K cryoshield 130, due to the implementation thereof copper or brass and similar to the third and fourth characteristic oscillatory mode 360 and 370, is also clearly distanced for the first characteristic oscillatory mode 330 from the approximately identical characteristic frequencies at the containers 110 and 120 and at the 20-K cryoshield 120. A further transmission of the oscillation of the 80-K cryoshield 130 to the 20-K cryoshield 120 and, further, to the helium container 110 is thus inhibited due to the effect of the cylindrical jacket 136 of the 80-K cryoshield 130 as a magneto-mechanical blocking filter. Corresponding curves 426 and 416 of the oscillatory amplitude A of the cylindrical jacket 126 of the 20-K cryoshield 120 and of the cylindrical jacket 116 of the helium container 110 exhibit correspondingly small amplitudes. The curve 426 for the 20-K cryoshield 120 is shown with a thin, solid line, and the curve 416 for the helium container 110 is shown with a boldface solid line.

Figure 10:
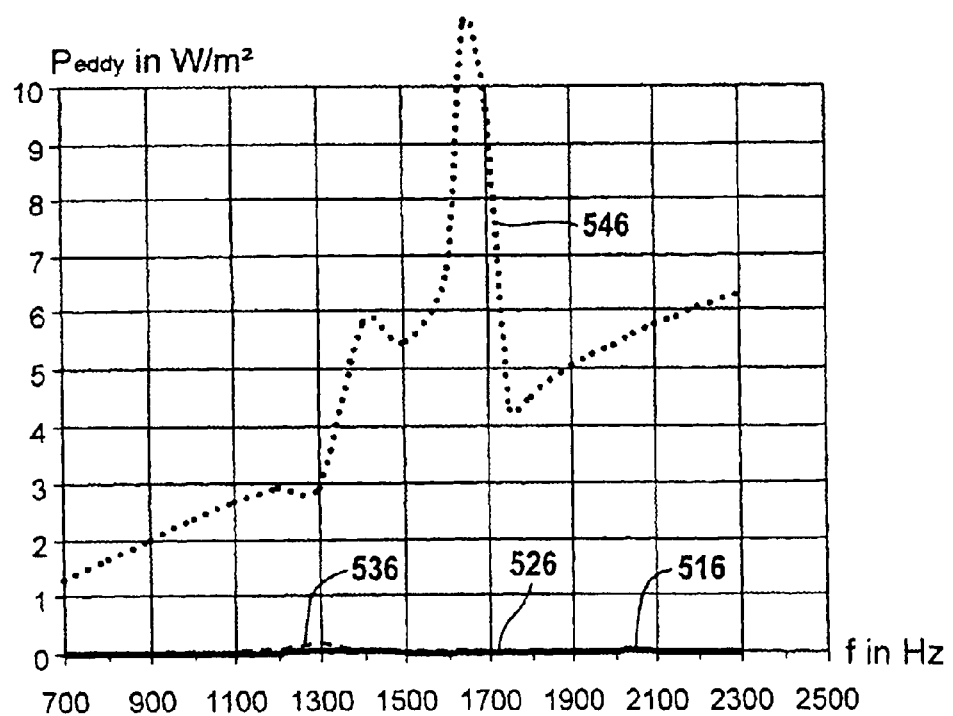
FIG. 10 shows curves of eddy current losses with respect to the frequency pertaining to FIG. 9.
Figure 11:
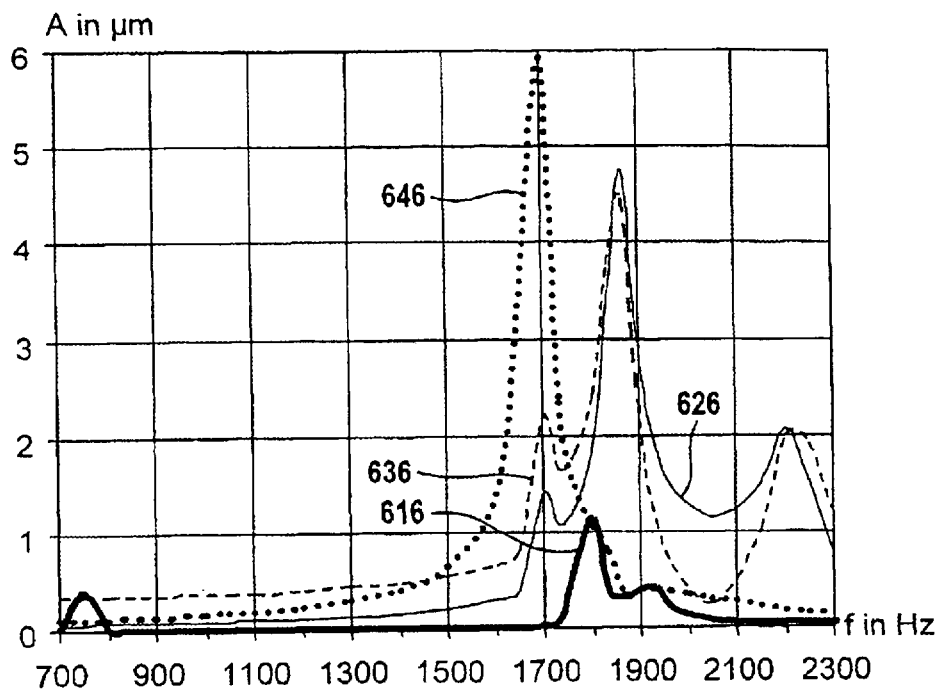
FIG. 11, for comparative purposes, curves of an oscillatory amplitude of components of a basic field magnet of the prior art.
Figure 12:
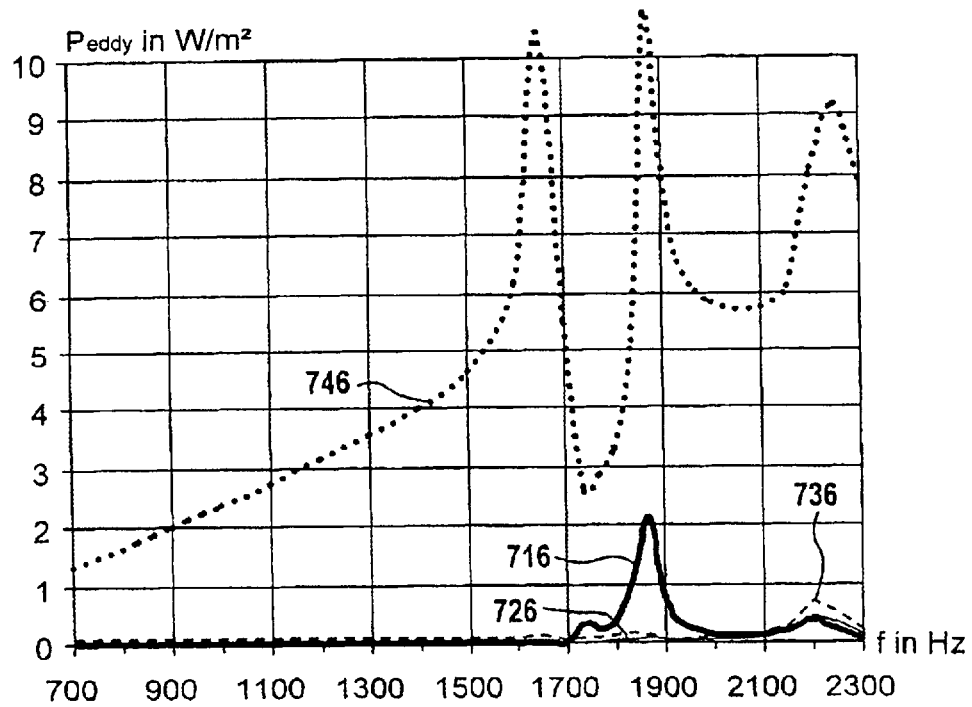
FIG. 12 for comparative purposes, curves of eddy current losses pertaining to FIG. 11.

Related to FIG. 9, FIG. 10 shows the curves 516, 526, 536 and 546 pertaining to the curves 416, 426, 436, 446 of the eddy current losses $P_{eddy}$ in the helium container 110, in the 20-K cryoshield 120, in the 80-K cryoshield 130 and in the vacuum container 140. The curves 516 through 546 are shown in the same way as corresponding curves 416 through 446 in FIG. 9. One can see that the eddy current losses $P_{eddy}$ in the helium container 110 are about equal to zero in frequency-independent fashion. As a result, losses in the helium container 110, in the superconducting coils 113 and in the helium are prevented. As a result, a low evaporation rate of the liquid helium is achieved as a consequence of the slight eddy current-induced heating of the helium container 110.

Corresponding to FIGS. 9 and 10, FIGS. 11 and 13 show curves 616, 626, 636 and 646—for comparative purposes— of an oscillatory amplitude A over the frequency f and appertaining curves 716, 726, 7367, and 746 of eddy current losses $P_{eddy}$ over the frequency f for a basic field magnet of the prior art. Compared to the basic field magnet 100 on which FIGS. 9 and 10 are based, the 80-K cryoshield in such a conventional basic field magnet is not formed of copper but of aluminum. The curves 616 through 746 are shown in the same way as corresponding curves 416 through 546 in FIGS. 9 and 10. Likewise for comparative purposes, the characteristic frequency $f_0$ of the inner cylindrical jacket of the 80-K cryoshield, further is first determined for the third and fourth characteristic oscillatory mode 360 and 370 of the 80-K cryoshield fabricated of aluminum. With R=0.465 m, E=78 GN/m$^2$ and ρ=2700 kg/m$^3$, a characteristic frequency $f_0$=1840 Hz arises, this being approximately the same as the characteristic frequencies $f_0$ given the 20-K cryoshield 120 of aluminum and given the containers 110 and 140 of stainless steel. Accordingly, no inhibition of the oscillatory transmission as a consequence of the magnetic coupling occurs in the basic field magnet of the prior art having containers of stainless steel and cryoshields of aluminum, so that the helium container as well as the 20-K cryoshield vibrate with noticeable amplitude and noticeable eddy current losses thus occur in the helium container. This can be seen particularly clearly by a comparison of FIGS. 11 and 12 to FIGS. 9 and 10.

Embodiments of at least one of the cylindrical jackets 116, 126, 136 and 146 are described below, these exhibiting an effect comparable to the above-described embodiment of the 80-K cryoshield 130 of copper or brass.

Figure 13:
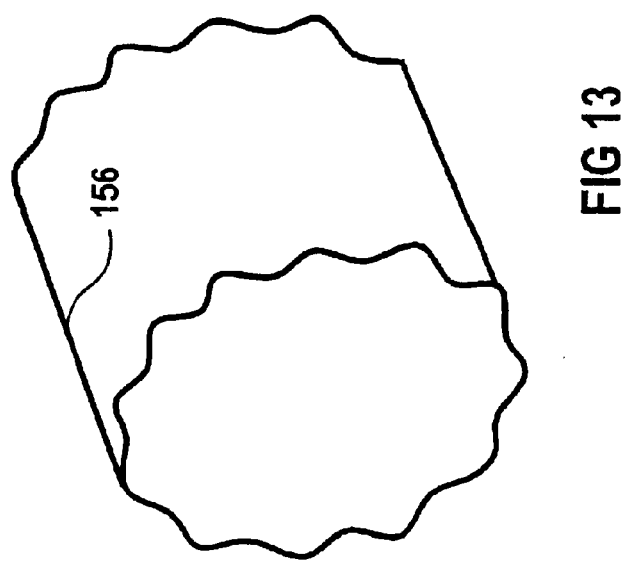
FIG. 13 illustrates a corrugated cylindrical jacket in accordance with the invention.

As an exemplary embodiment of the invention, FIG. 13 shows an inner cylindrical jacket 156 having a corrugated shaping. Compared to the non-corrugated cylindrical jackets 116, 126, 136 and 146, the force/dilatation behavior for circumferential forces in the corrugated cylindrical jacket 156 becomes flatter, which means a smaller effective modulus of elasticity A, and, thus the characteristic frequency $f_0$ is effectively lowered. Shapings having wave amplitudes of less than approximately 0.5 cm and wavelengths from 5 through 30 cm are adequate for this purpose. Due to the corrugation, a reduced modulus of elasticity of, for example, E=20 GN/m$^2$ arises for the corrugated, inner cylindrical jacket 156 of an 80-K cryoshield R=0.465 m) of aluminum (ρ=2700 kg/m$^3$), so that a characteristic frequency $f_0$=932 Hz arises. For inhibiting transmission of vibrations, it is particularly advantageous for a superconducting basic field magnet to alternate non-corrugated cylindrical jackets with corrugated cylindrical jackets.

Figure 14:
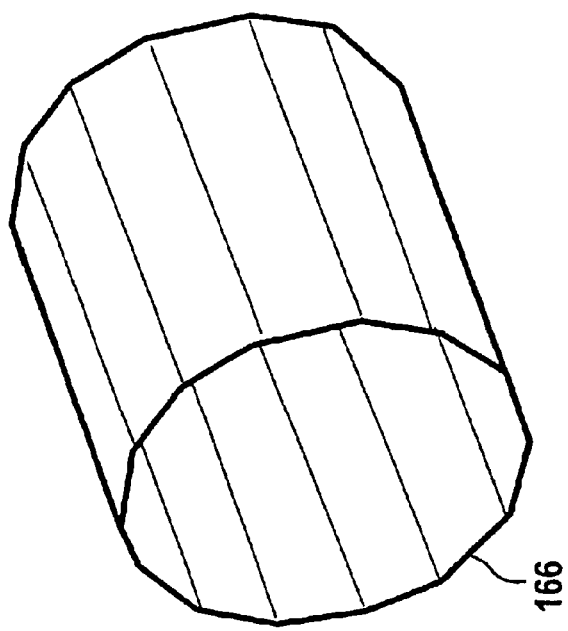
FIG. 14 illustrates a cylindrical jacket having a polygonal cross-section.

As a further exemplary embodiment of the invention, FIG. 14 shows an inner cylindrical jacket 166 having a polygonal cross-section. Effects similar to those set forth above for FIG. 13 are thereby achieved.

Figure 15:
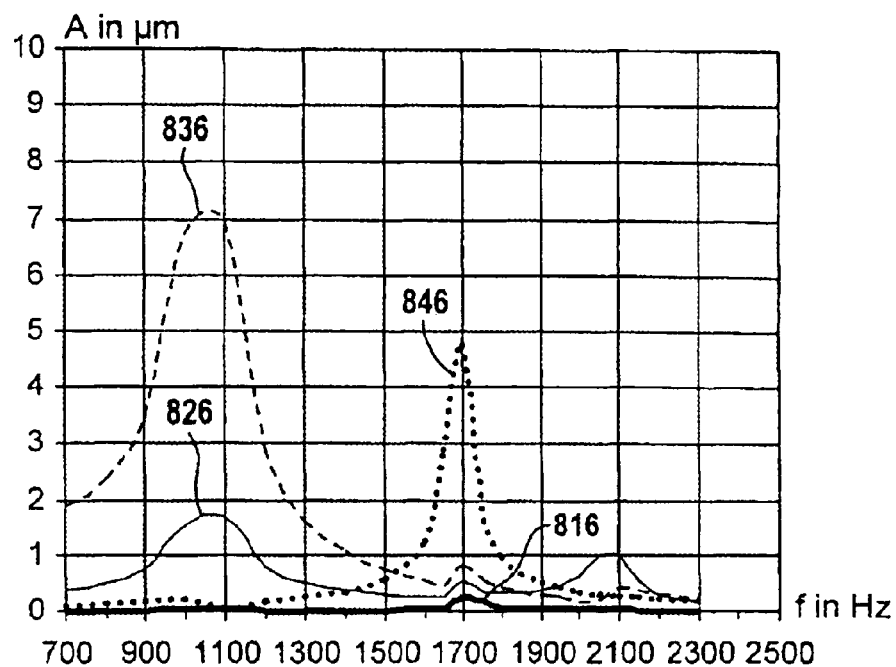
FIG. 15 shows curves of oscillatory amplitudes for a basic field magnet having a cylindrical jacket according to FIG. 13 or FIG. 14.
Figure 16:
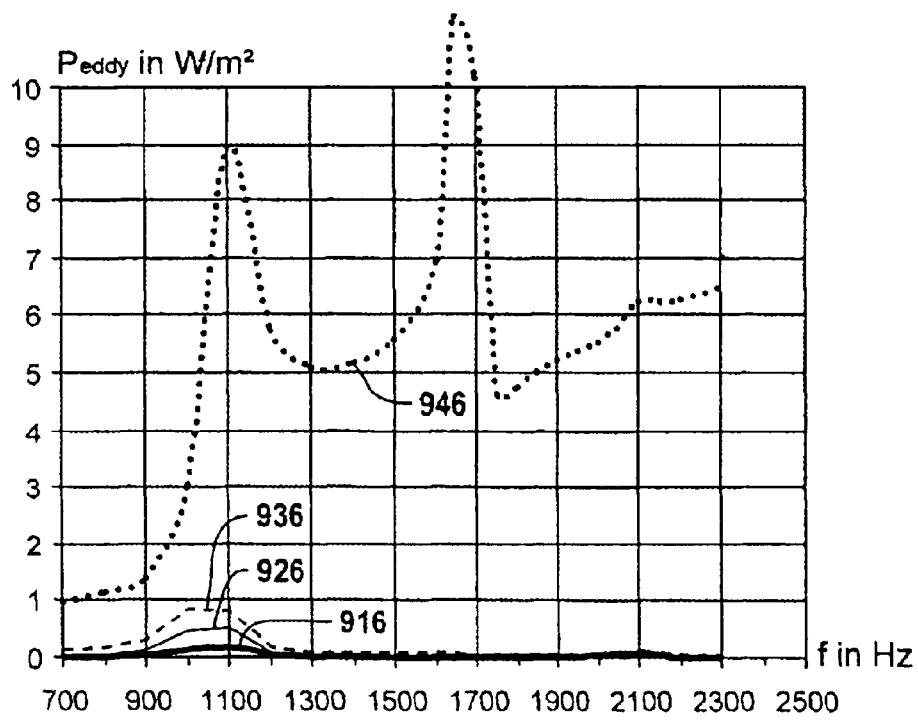
FIG. 16 shows curves of eddy current losses pertaining to FIG. 15.

Corresponding to FIGS. 9 and 10, FIGS. 15 and 16 show curves 816, 826, 836 and 846 of an oscillatory amplitude A over the frequency f and appertaining curves 916, 926, 936 and 946 of eddy current losses $P_{eddy}$ over the frequency f for a basic field magnet that, compared to the basic field magnet 100 on which FIGS. 9 and 10 are based, does not have an 80-K cryoshield 130 of copper but an 80-K cryoshield of aluminum fashioned in conformity with FIG. 13 or FIG. 14 having the inner cylindrical jacket 156 or 166. The curves 816 through 946 are shown in the same way as the corresponding curves 416 through 546 in FIGS. 9 and 10. When FIGS. 15 and 16 are compared to FIGS. 9 and 10, one can see that the 80-K cryoshield having the inner cylindrical jacket 156 or 166 of aluminum and the 80-K cryoshield 130 having the non-corrugated, inner cylindrical jacket 136 of copper or brass have an essentially equivalent effect with respect to the inhibition of the oscillatory transmission in the direction of the helium container 110 and with respect to a reduction of eddy current losses in the helium container 110.

Figure 17:
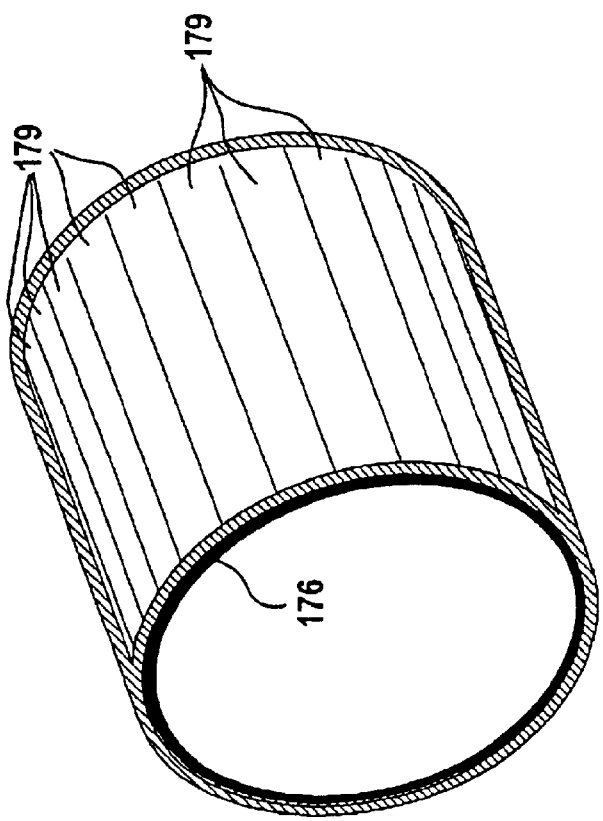
FIG. 17 illustrates a cylindrical jacket occupied with strips in accordance with the invention.

As a further exemplary embodiment of the invention, FIG. 17 shows an inner cylindrical jacket 176 that is occupied with strips 179 with a heavy mass. Due to this increase in the mass moment of inertia that occurs by the cylindrical jacket 176 being made heavier due to the occupation with the strips 179, a low ratio of modulus of elasticity E to density p and, thus, a low characteristic frequency $f_0$ are achieved. It should be noted that the modulus of elasticity E should be kept unmodified insofar as possible and only the density ρ should be increased due to the occupation with strips having high mass that are spaced from one another by slots. Accordingly, no lowering of the characteristic frequency $f_0$ can be achieved exclusively by means of a greater wall thickness of one of the inner cylindrical jackets 116, 126, 136 and 146, since the mechanical stiffness, which is reflected in the modulus of elasticity A, also increases together with a greater wall thickness. In one embodiment, for example, 5 through 30 cm wide strips 179 of aluminum, steel or lead are secured by soldering, welding riveting or the like to the inner cylindrical jacket 176 in longitudinal direction.

Figure 18:
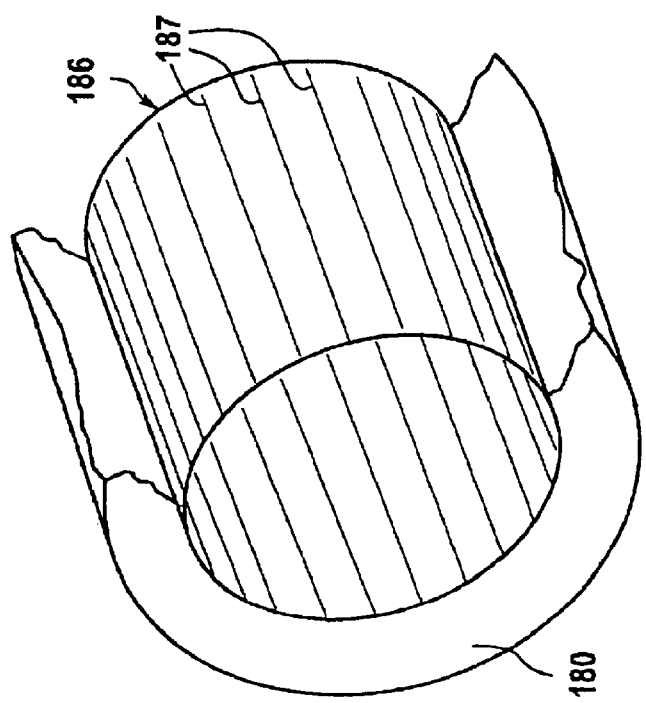
FIG. 18 illustrates a cryoshield having a slotted, inner cylindrical jacket in accordance with the invention.

As a further exemplary embodiment of the invention, FIG. 18 shows a cryoshield 180 whose inner cylindrical jacket 186 is fashioned slotted in axial direction. The hollow-cylindrical cryoshield 180 is shown with a portion of the end face and an excised outer cylindrical jacket. The cylindrical 186 is thus composed of at least three, and up to approximately 30 individual segments that are separated from one another in the circumferential direction by slots 187. The segments are connected to the end faces with good thermal conductivity. The reduced characteristic frequency f0 of the cylindrical 186 fashioned in this way is derived from the interruption of mechanical circumferential stresses given radial motion, and thus reduced restoring forces.

Although modifications and changes may be suggested by those skilled in the art, it is the intention of the inventor to embody within the patent warranted hereon all changes and modifications as reasonably and properly come within the scope of his contribution to the art.

I claim as my invention:

1. A magnetic resonance apparatus comprising:
   a basic field magnet having an inner unit, an outer unit and a middle unit each being formed as a hollow cylinder having an inner cylindrical jacket, and each being electrically conductive, said inner unit being enveloped by said middle unit and said middle unit being enveloped by said outer unit;
   a gradient coil system which causes eddy currents to be induced at least in regions of said outer unit; and
   the inner cylindrical jackets of said inner unit, said outer unit and said middle unit each having a characteristic frequency, and the characteristic frequency of said middle unit being detuned relative to at least one of the respective characteristic frequencies of said outer unit and the inner cylindrical jackets of said inner unit, so that said middle unit damps oscillatory transmission due to magnetic coupling from said outer unit to said inner unit.

2. A magnetic resonance apparatus as claimed in claim 1 wherein the inner cylindrical jacket of said middle unit has at least three slots therein in an axial direction.

3. A magnetic resonance apparatus as claimed in claim 1 wherein at least one of the inner cylindrical jackets is corrugated in a circumferential direction.

4. A magnetic resonance apparatus as claimed in claim 1 wherein at least one of the inner cylindrical jackets has a polygonal cross-section.

5. A magnetic resonance apparatus as claimed in claim 1 wherein at least one of the inner cylindrical jackets is occupied with oblong strips of a material proceeding in an axial direction.

6. A magnetic resonance apparatus as claimed in claim 5 wherein said material is selected from the group consisting of aluminum, steel and lead.

7. A magnetic resonance apparatus as claimed in claim 1 wherein one of said inner cylindrical jackets is formed of a first material and another of said inner cylindrical jackets is formed of a second material, said first material having a quotient of modulus of elasticity-to-density that is different from a quotient of modulus of elasticity-to-density of said second material.

8. A magnetic resonance apparatus as claimed in claim 7 wherein at least one of said first material and said second material is a non-magnetic material with good electrical conductivity.

9. A magnetic resonance apparatus as claimed in claim 7 wherein said first material is selected from the group consisting of non-magnetic stainless steel and aluminum, and wherein said second material is selected from the group consisting of copper and brass.

10. A magnetic resonance apparatus as claimed in claim 1 wherein said inner unit is a helium container, said middle unit is a cryoshield, and said outer unit is a vacuum container for a superconducting basic field magnet.

* * * * *